(12) United States Patent
Kim et al.

(10) Patent No.: US 7,279,419 B2
(45) Date of Patent: Oct. 9, 2007

(54) FORMATION OF SELF-ALIGNED CONTACT PLUGS

(75) Inventors: Hyun T. Kim, Boise, ID (US); Byron N. Burgess, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/495,437

(22) Filed: Jul. 28, 2006

(65) Prior Publication Data

US 2006/0264047 A1    Nov. 23, 2006

Related U.S. Application Data

(63) Continuation of application No. 10/690,317, filed on Oct. 20, 2003.

(51) Int. Cl.
*H01L 21/44* (2006.01)

(52) U.S. Cl. .............. 438/668; 438/279; 438/586; 438/666; 438/667; 438/669; 438/637; 438/675; 438/704

(58) Field of Classification Search ............ 438/279, 438/586, 637, 666–669, 675, 704
See application file for complete search history.

(56) References Cited

U.S. PATENT DOCUMENTS

| 5,296,400 | A | 3/1994 | Park et al. ............... 999/52 |
|---|---|---|---|
| 5,482,894 | A | 1/1996 | Havemann ............. 999/195 |
| 5,897,372 | A | 4/1999 | Howard .................. 438/437 |
| 6,287,957 | B1 | 9/2001 | Linliu ..................... 438/634 |
| 6,380,106 | B1 | 4/2002 | Lim et al. ................ 438/778 |
| 6,423,645 | B1 | 7/2002 | Wei et al. ................ 438/738 |
| 6,451,708 | B1 | 9/2002 | Ha ........................... 438/738 |
| 6,548,313 | B1 | 4/2003 | Ravi et al. ................... 438/6 |
| 6,624,088 | B2 | 9/2003 | Moore ..................... 438/303 |
| 7,126,198 | B2 * | 10/2006 | Steiner et al. ............ 257/412 |
| 2003/0205241 | A1 * | 11/2003 | Aoki .............................. 134/3 |
| 2004/0058517 | A1 * | 3/2004 | Nallan et al. ............. 438/585 |
| 2004/0072446 | A1 * | 4/2004 | Liu et al. .................. 438/719 |
| 2004/0151062 | A1 * | 8/2004 | Yao et al. ................. 366/137 |

FOREIGN PATENT DOCUMENTS

EP    0489785 A2    6/1998

* cited by examiner

*Primary Examiner*—Mary Wilczewski
*Assistant Examiner*—Bac H. Au

(57) ABSTRACT

Methods of forming a contact structure for semiconductor assemblies are described. One method provides process steps to create an inner dielectric isolation layer after the contact region is protected, which is followed by the formation of the self-aligned contact structures. A second method provides process steps to create an inner dielectric isolation layer after the self-aligned contact structures are formed.

16 Claims, 14 Drawing Sheets

FORMATION OF SELF-ALIGNED CONTACT PLUGS

This application is a continuation to U.S. patent application Ser. No. 10/690,317, filed Oct. 20, 2003.

FIELD OF THE INVENTION

This invention relates to semiconductor fabrication processing and, more particularly, to methods for forming self-aligned contact plugs for semiconductor devices, such as dynamic random access memories (DRAMs).

BACKGROUND OF THE INVENTION

The continuing trend of scaling down integrated circuits has motivated the semiconductor industry to consider new techniques for fabricating precise components at sub-micron levels. One important area in semiconductor fabrication is forming the interconnecting structure within the integrated circuit and particularly connection between a transistor and other devices.

As is the case for most semiconductor integrated circuitry, circuit density is continuing to increase at a fairly constant rate. In semiconductor devices it may be advantageous to build contact plugs for interlayer connections having high aspect ratio structures, as circuit density will be enhanced. In that light, the ability to precisely align contact plugs to their associated devices becomes a crucial requirement of semiconductor manufacturing technologies if future generations of expanded memory array devices are to be successfully manufactured.

Forming contact plugs to regions in a semiconductor device are well known. See for example U.S. Pat. No. 6,518,626 describing a self-aligned contact to a source/drain region of a transistor. The contact is fabricated between transistor gate stacks having sidewall spacers, often formed of an oxide or nitride. The process includes forming an insulating layer, for example an oxide such as BPSG, over the gate stacks and etching through the insulating layer. The sidewall spacers on the gate stack protect the gate stack and allow for lateral margin during the etching process. The etching process, however, does remove some of the sidewall spacer. As the thickness of the spacer decreases with advances in semiconductor designs, removal of a portion of the spacer can create short circuits between the transistor gate stack and the conductive contact plug.

Removing doped oxide relative to un-doped oxide can be more difficult than removing an oxide relative to nitride. Therefore, prior art used a nitride sidewall spacer and a layer of oxide over the gate stack. Prior self aligned contact processes used an etch process to remove the oxide (BPSG) selectively to nitride. Depending upon the selectivity used, a polymer layer is re-deposited on the sidewall spacer during the etch operation. The higher the selectivity the thicker the polymer layer becomes. As such, if too high of a selectivity is used the contact opening can become blocked with the polymer layer. Balancing the thickness of the polymer layer, etch selectivity, contact width and the thickness of the sidewall spacer is challenging. Prior etch processes have been limited to a selectivity of oxide to nitride in the range of less than 40:1.

Embodiments of the present invention describe methods to form self-aligned contact plugs that address the above challenges, the methods disclosed herein for use in the manufacture of semiconductor assemblies, which will become apparent to those skilled in the art from the following disclosure.

SUMMARY OF THE INVENTION

Exemplary implementations of the present invention include methods to form self-aligned contact plugs. One method provides process steps that creates an inner dielectric isolation layer after the contact region is protected, which is followed by the formation of the self-aligned contact structures. A second method provides process steps that create an inner dielectric isolation layer after the self-aligned contact structures are formed.

DETAILED DESCRIPTION OF THE INVENTION

Embodiments of the present invention provide methods of forming transistor contacts without degrading sidewall spacers. In some embodiments either a photoresist or amorphous carbon material is used to fill a region between transistor gate stacks. The photoresist or amorphous carbon material can be removed to expose the source/drain contact area without substantial sacrificial removal of the sidewall spacer. That is, the photoresist or amorphous carbon material can be removed with greater selectivity to the spacer material than prior materials. For example, a dry develop process can be performed to remove the amorphous carbon material. It will be appreciated by those in the art with the benefit of the present disclosure that the present invention is not limited to photoresist or amorphous carbon material but can be implemented with other materials that can be removed without etching a sidewall spacer. For example, a filler material can be used that can be removed with a selectively to nitride greater than about 40:1. The increased selectivity allows the formation of a self-aligned contact in a contact opening having an aspect ratio (depth:width) greater than 5:1 while using a nitride spacer. The present invention is described herein with reference to a series of contacts between adjacent transistors, but can be implemented in stand alone, or discrete contacts.

Exemplary implementations of the present invention are directed to processes for forming self-aligned contact plugs in a semiconductor device as depicted in the embodiment of FIGS. 1-10 and the embodiment of FIGS. 11-22.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

Figure 1:
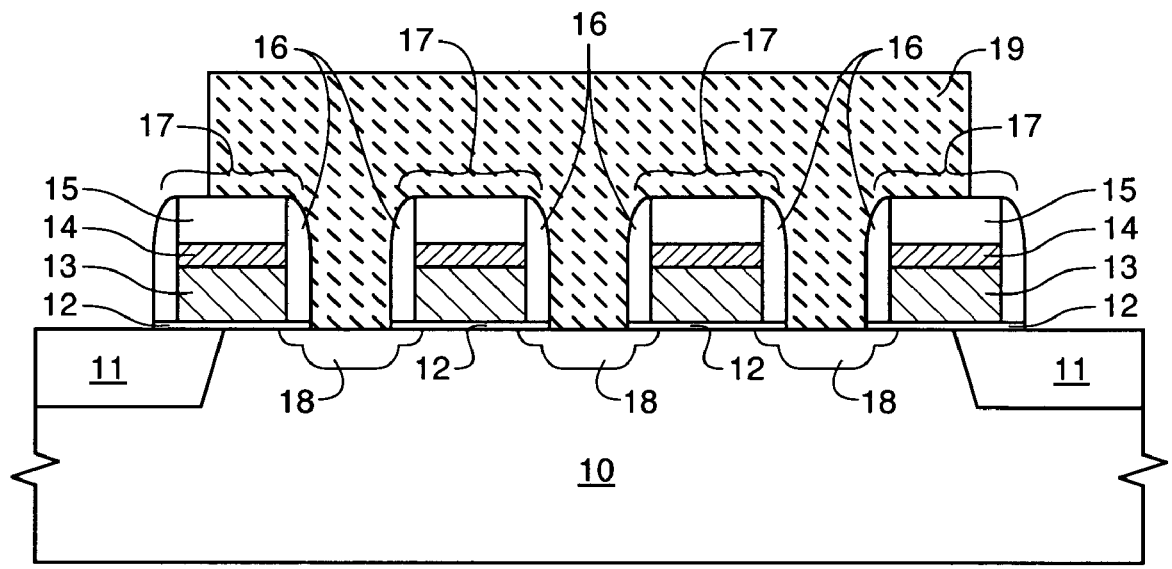
FIG. 1 is a cross-sectional view of a semiconductor substrate section depicting storage cell access transistors on a silicon substrate and an overlying patterned photoresist to cover the active region.

Referring now to FIG. 1, substrate 10 is prepared for processing steps of an embodiment of the present embodiment. Substrate 10 may be a silicon material, such as a conductively doped silicon wafer. Processing steps known by one skilled in the art can be used to form field effect transistors (FETs), comprising source/drain regions 18 that span between insulated transistor gate electrodes 17. Insulated transistor gate electrodes 17 are made up of transistor gate oxide 12 and conductive layers 13 and 14, such as polysilicon and silicide, respectively, which are isolated by transistor gate cap insulator 15 and gate spacers 16, made from dielectric materials such as nitride. The field effect transistors (FETs) are isolated from adjacent structures by field oxide or trench isolation material 11. A masking layer 19, such as photoresist or preferably transparent amorphous carbon is placed and then patterned to cover the defined active region of the FETs into which the source/drain regions where formed.

Figure 2:
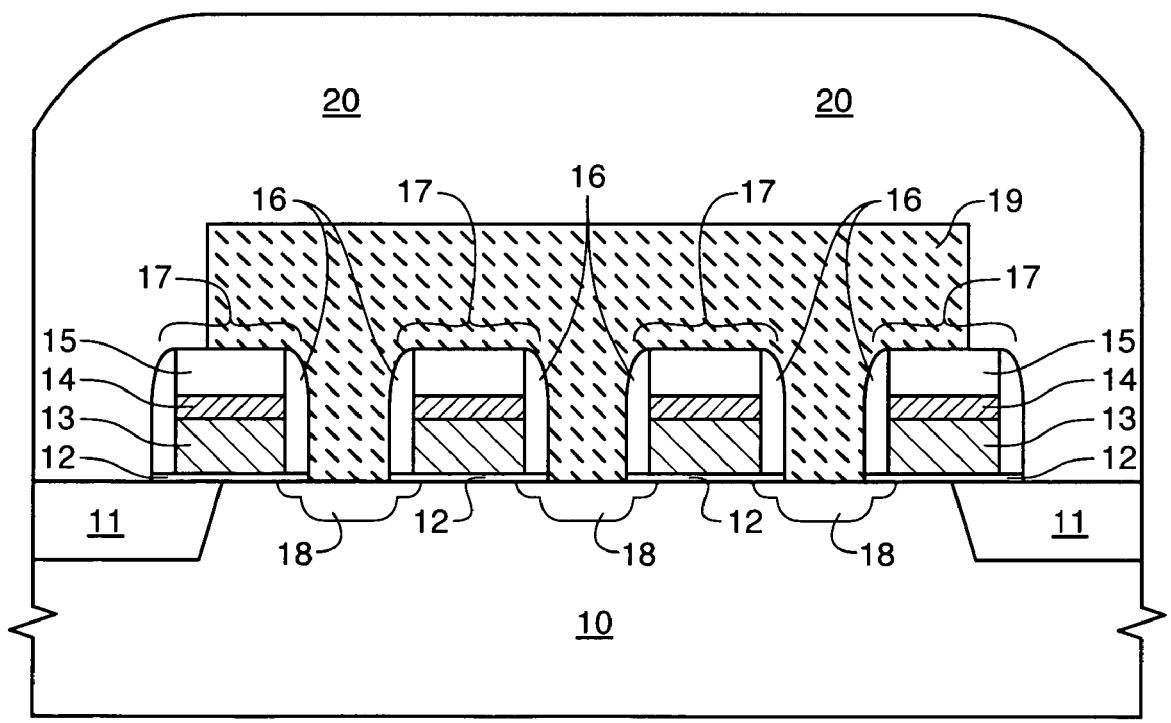
FIG. 2 is a subsequent cross-sectional view taken from FIG. 1 following the formation of an inner dielectric layer (IDL) to cover the semiconductor substrate section.

Referring now to FIG. 2, an inner dielectric layer (IDL) 20 is formed to cover the entire semiconductor substrate section. It is preferred that the IDL 20 be an oxide that is formed by a process which utilizes a low process temperature that is below 600° C. (a temperature of approximately 550° C. or lower is preferred), such as using a Plasma Enhanced Chemical Vapor Deposition (PECVD) process. Processing the IDL at a low temperature is important so that the integrity of the amorphous carbon is maintained. The amorphous carbon has weak carbon bonding, bonding that is susceptible to being broken if exposed to excessive heat. At a temperature below 600° C., the films' original characteristics remain without any substantial deformation, burning, volume change or reflow of the film.

Figure 3:
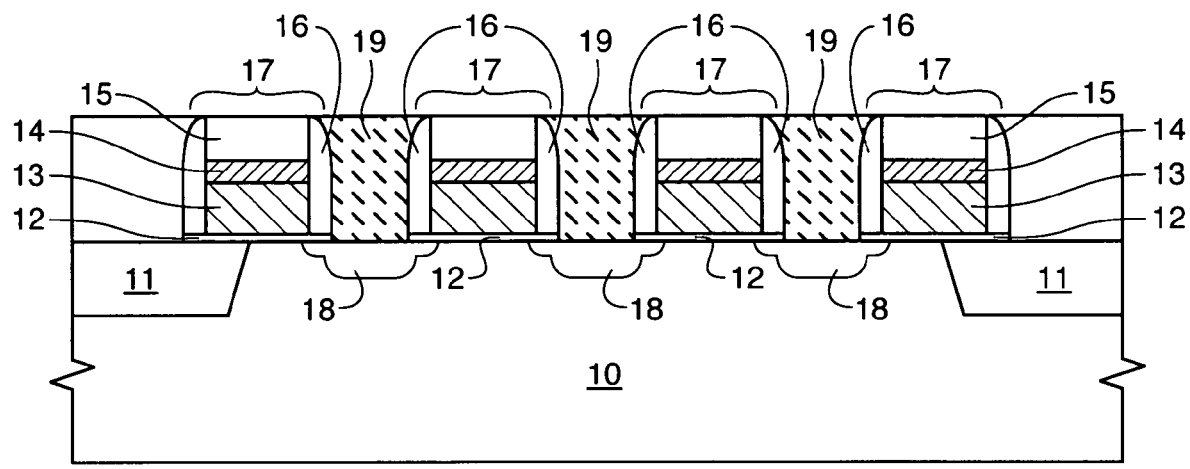
FIG. 3 is a subsequent cross-sectional view taken from FIG. 2 following the planarization of the IDL and the photoresist, with the planarization stopping on the top surfaces of the transistor gates of the storage cell access transistors.

Referring now to FIG. 3 the IDL 20 and the masking layer 19 are planarized with the planarization step stopping on the transistor gate cap insulator 15 of each the storage cell access transistors.

Figure 4:
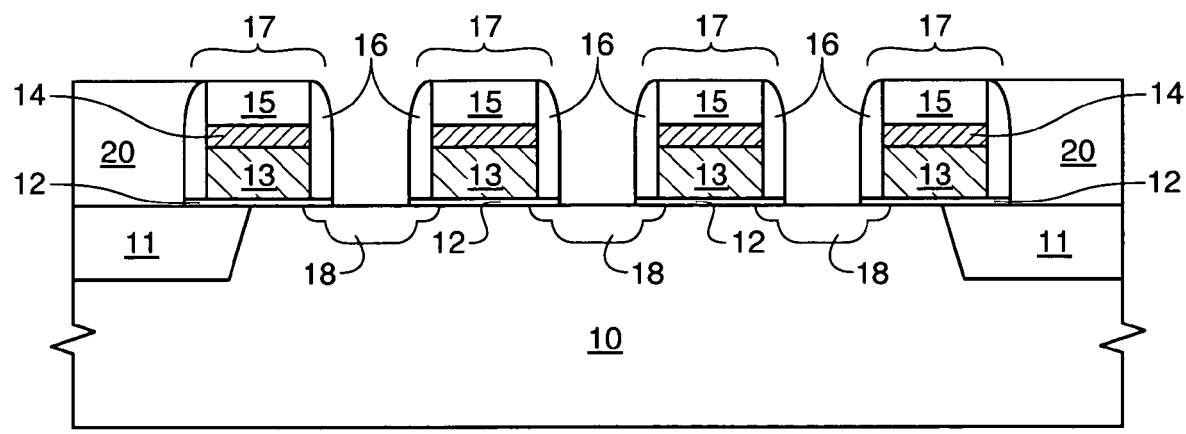
FIG. 4 is a cross-sectional view taken from FIG. 5 following the removal of the remaining planarized photoresist.

Referring now to FIG. 4, the remaining sections of planarized masking layer 19 is removed to expose source/drain regions 18 and also to leave sections of IDL 20 to isolate the access transistor structures where they overly the trench isolation material 11. If masking layer 19 is photoresist it is stripped using conventional methods, if the masking layer is amorphous carbon, it is removed using dry development processing. The dry development processing used to remove either the photoresist or the amorphous carbon can be a typical dry etch process known to those skilled in the art, such as a process utilizing an $O_2/SO_2$ etch chemistry. The process steps depicted in FIG. 1-4 allow for the subsequent formation of self-aligned contact plugs as described in FIG. 5 and 6.

Figure 5:
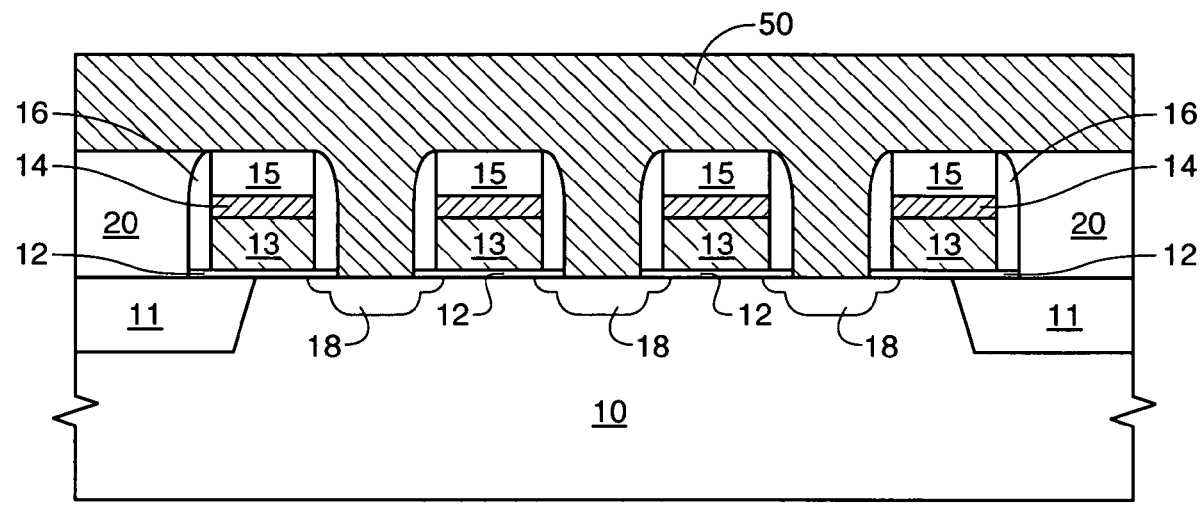
FIG. 5 is a cross-sectional view taken from FIG. 4 following the formation of a conductor over the planarized IDL, over the transistor gates and into the opening between each transistor gate created by the removal of the planarized photoresist.

Referring now to FIG. 5 a conductor 50, such as a conductively doped polysilicon, which is preferred, is formed over the planarized IDL sections 20, over the transistor gates 17 and into the opening between each transistor gate created by the removal of the planarized masking layer 19 (seen in FIG. 3). Other conductors, such as a metal or metal silicide can be used for conductor 50 if so desired.

Figure 6:
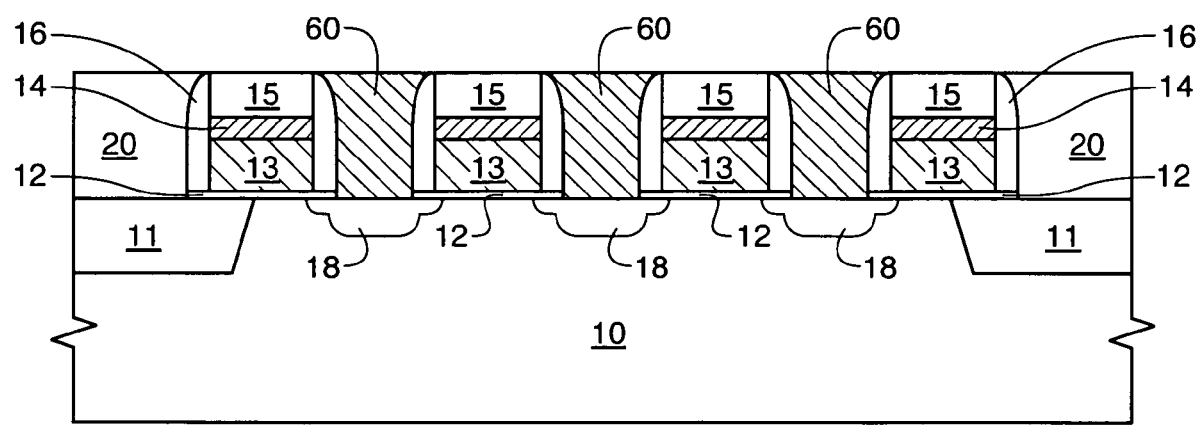
FIG. 6 is a cross-sectional view taken from FIG. 5 following the planarization of the conductor to form contact plugs between the transistor gates and connecting to underlying conductively doped source/drain regions.

Referring now to FIG. 6 conductor 50 is planarized such that this planarization step stops on transistor gate cap isolation 15 to form self-aligned contact plugs 60 that align between the transistor gates 17 and connect to underlying conductively doped source/drain regions 18.

Figure 7:
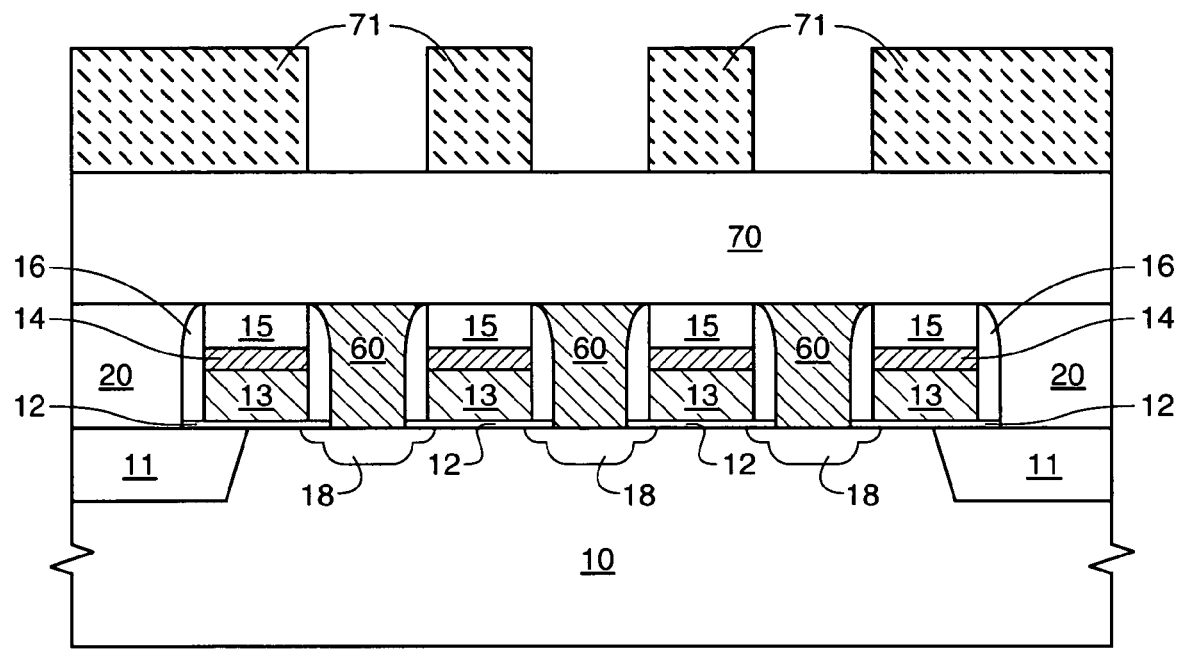
FIG. 7 is a cross-sectional view taken from FIG. 6 following the formation of a second inner dielectric layer and an overlying patterned layer of photoresist.

Referring now to FIG. 7 a second inner dielectric layer (IDL) 70 is formed to cover the sections of isolation regions 20, transistor gate electrodes 17 and self-aligned contact plugs 60 and then planarized. Next, a second masking layer 71, such as photoresist is formed and patterned such that the patterned masking layer lines up with the underlying self-aligned contact plugs 60.

Figure 8:
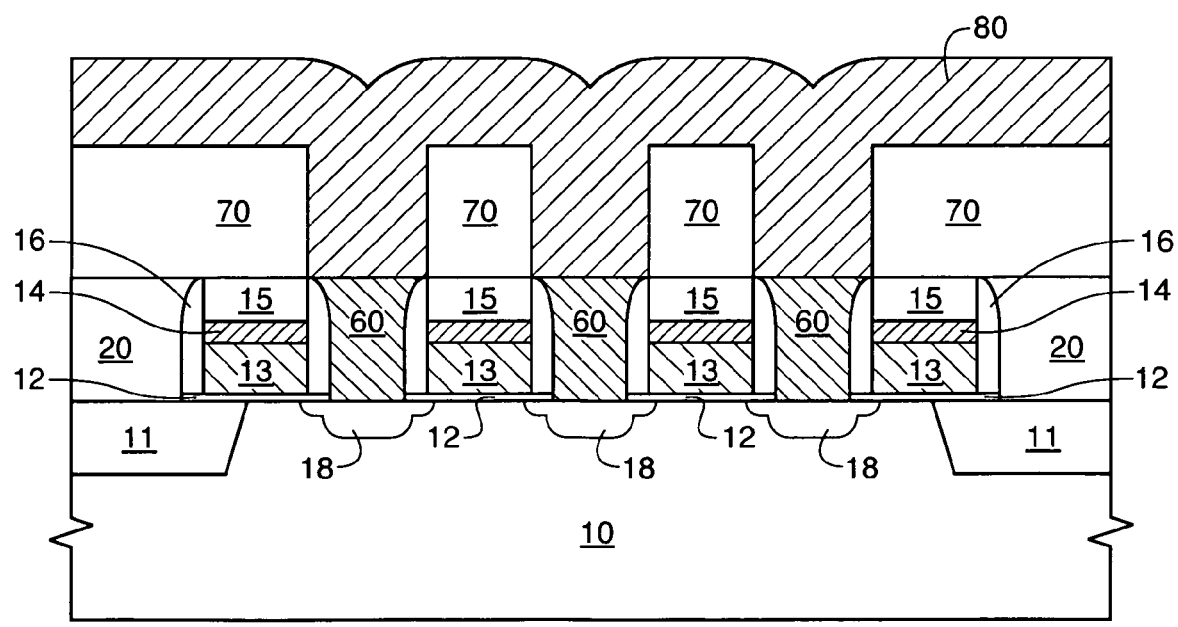
FIG. 8 is a subsequent cross-sectional view taken from FIG. 7 after an etch step forms holes into the second IDL that provides access to the underlying conductive plugs followed by the formation of an overlying conductive layer that covers the second IDL and fills the holes to make contact with the underlying conductive plugs.

Referring now to FIG. 8, an etch step forms holes into the second IDL 70 to provide access to the underlying conductive plugs 60 and the masking layer 71 is also stripped. Next, overlying conductive layer 80 is formed that covers the second IDL 70 and fills the holes to make contact with the underlying conductive plugs 60.

Figure 9:
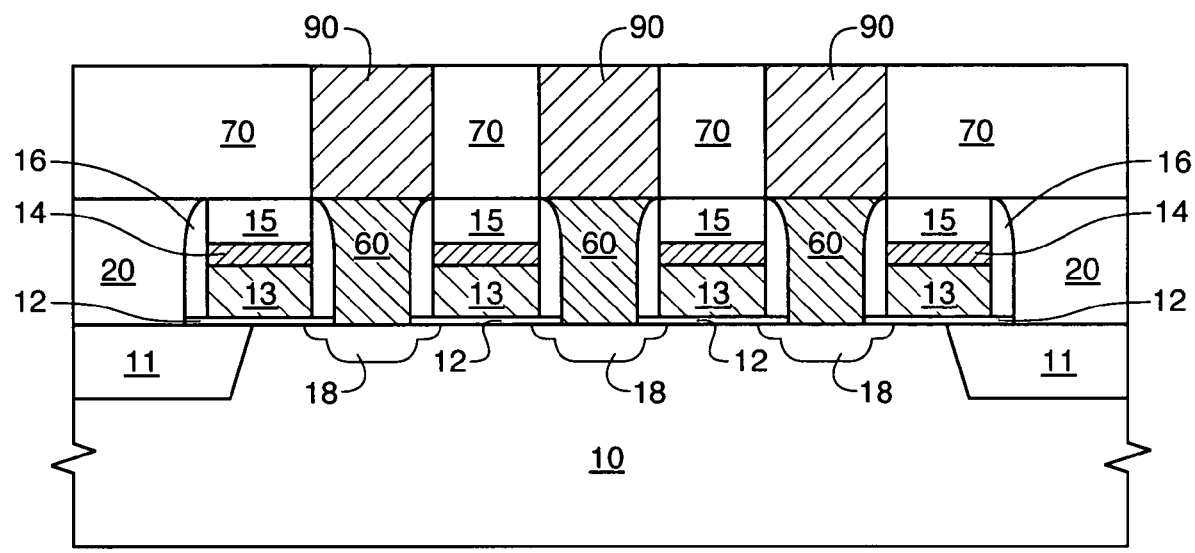
FIG. 9 is a cross-sectional view taken from FIG. 8 following the planarization of the second conductive layer to form a separate interconnect to each underlying conductive plug.

Referring now to FIG. 9, the second conductive layer 80 is planarized to form a separate interconnect 90 to each underlying conductive plug 80.

Figure 10:
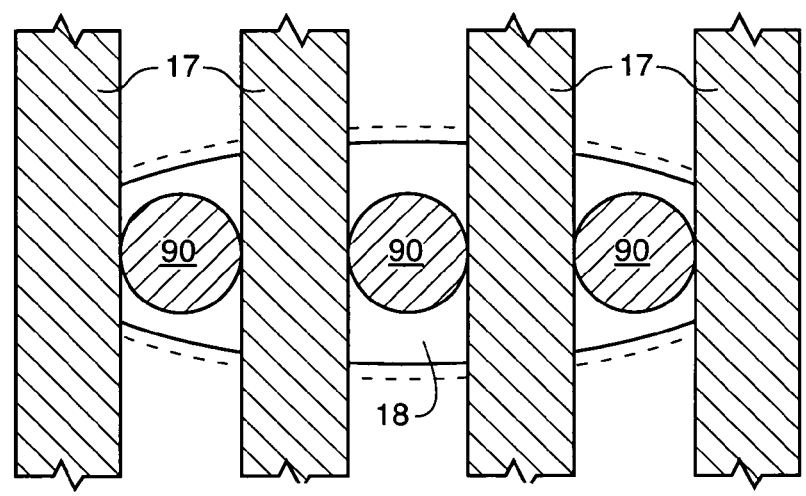
FIG. 10 is an overhead plan view of FIG. 9 showing a completed interconnect structure between transistor source/drain regions and a self-aligned contact plug depicting an embodiment of the present invention.

FIG. 10 is an overhead plan view of FIG. 9 showing a completed interconnect structure between transistor source/drain regions 18 and each self-aligned contact plug 60 (not seen) and the interconnects 90, which depicts an embodiment of the present invention. The semiconductor assembly is then completed using fabrication methods known to those skilled in the art.

Figure 11:
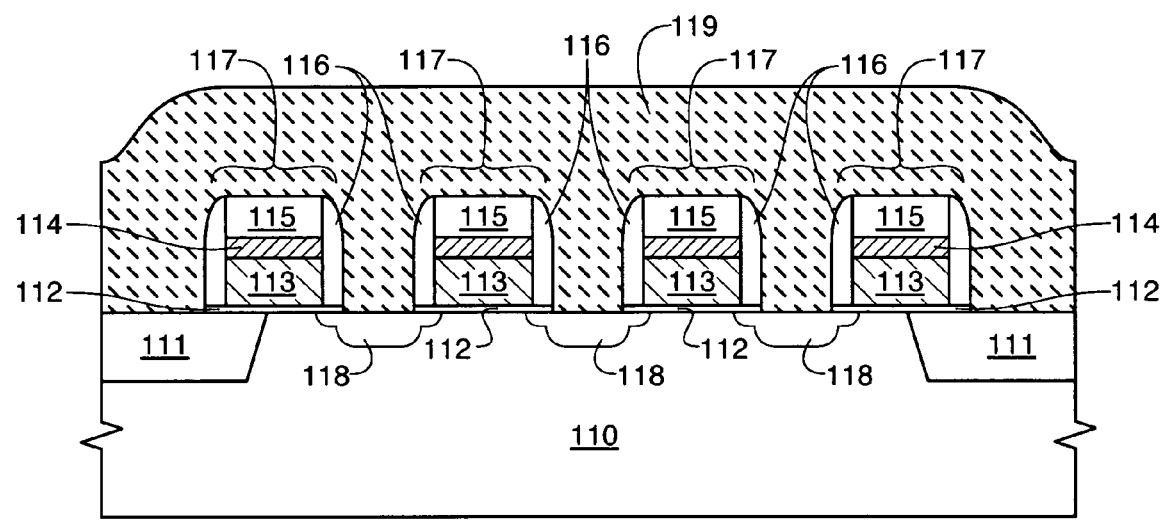
FIG. 11 is a cross-sectional view of a semiconductor substrate section depicting storage cell access transistors on a silicon substrate and an overlying amorphous carbon to cover the entire semiconductor substrate section.

A second embodiment of the present invention is depicted in FIG. 11-23. Referring now to FIG. 11, substrate 110 is prepared for the processing steps of the present embodiment. Substrate 110 may be a silicon material, such as a conductively doped silicon wafer. Processing steps, known by one skilled in the art, are used to form field effect transistors (FETs), comprising source/drain regions 118 that span between insulated transistor gate electrodes 117. Insulated transistor gate electrodes 117 are made up of transistor gate oxide 112 and conductive layers 113 and 114, such as polysilicon and silicide, respectively, which are isolated by transistor gate cap insulator 115 and gate spacers 116, made from dielectric materials such as nitride. The field effect transistors (FETs) are isolated from adjacent structures by field oxide or trench isolation material 111. A transparent amorphous carbon layer 119 is placed to cover the entire semiconductor substrate section.

Figure 12:
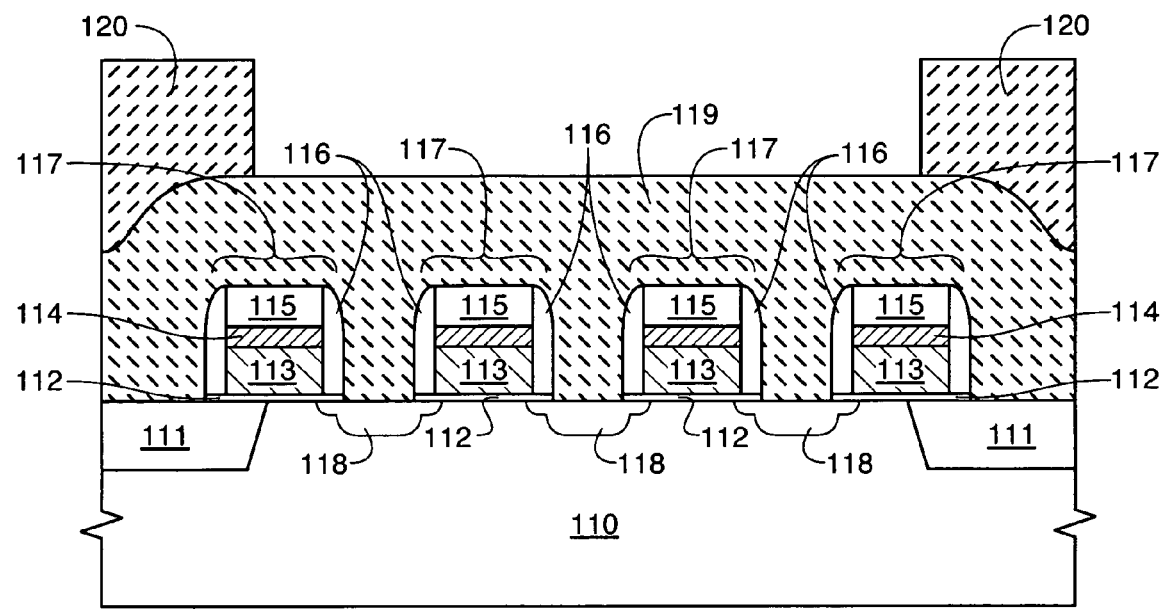
FIG. 12 is a subsequent cross-sectional view taken from FIG. 11 following the formation of a patterned photoresist that covers the area lying outside of the underlying active area and exposed the amorphous carbon overlying the active area.

Referring now to FIG. 12, a photoresist 120 is placed and patterned such that the patterned photoresist 120 exposes the portion of the amorphous carbon 119 overlying the active area (also the future contact plug region) and covers the area lying outside of the underlying active area in which the source/drain regions 118 have been formed.

Figure 13:
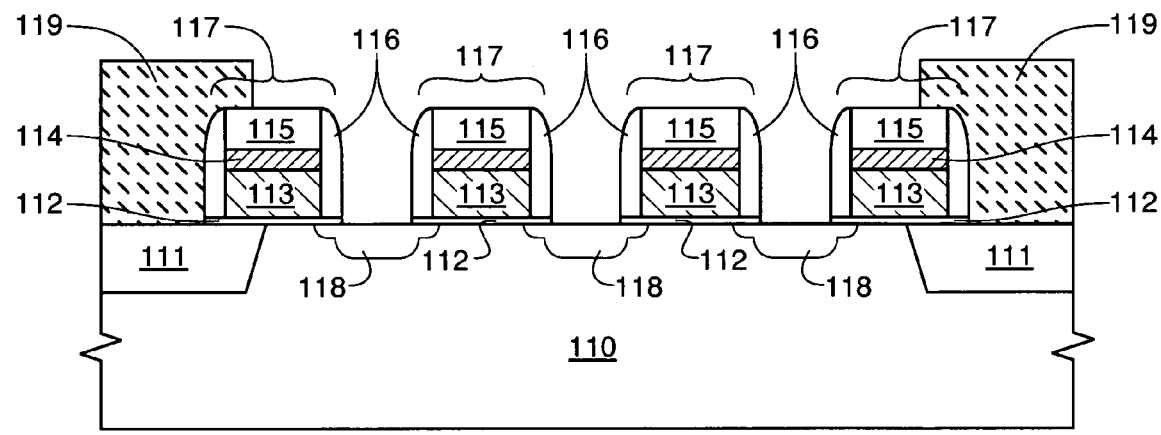
FIG. 13 is a subsequent cross-sectional view taken from FIG. 12 following the removal of the exposed amorphous carbon to provide an opening to give access to the underlying source/drain regions of the transistors.

Referring now to FIG. 13, the exposed region of amorphous carbon 119 is removed to provide openings that give access to the underlying source/drain regions 118 of the access transistors. The patterned photoresist 120 is stripped to leave sections of amorphous carbon 119 remaining that cover the portions of the access transistors that overly the trench isolation sections 111. Using dry development to open the contact plug regions is preferred as the amorphous carbon dry develop selectivity to nitride is near infinite. (The preferred material used to form transistor gate cap insulator 115 and transistor spacers 116.) The process steps depicted in FIG. 11-13 allow for the subsequent formation of self-aligned contact plugs as described in FIG. 14-16.

Figure 14:
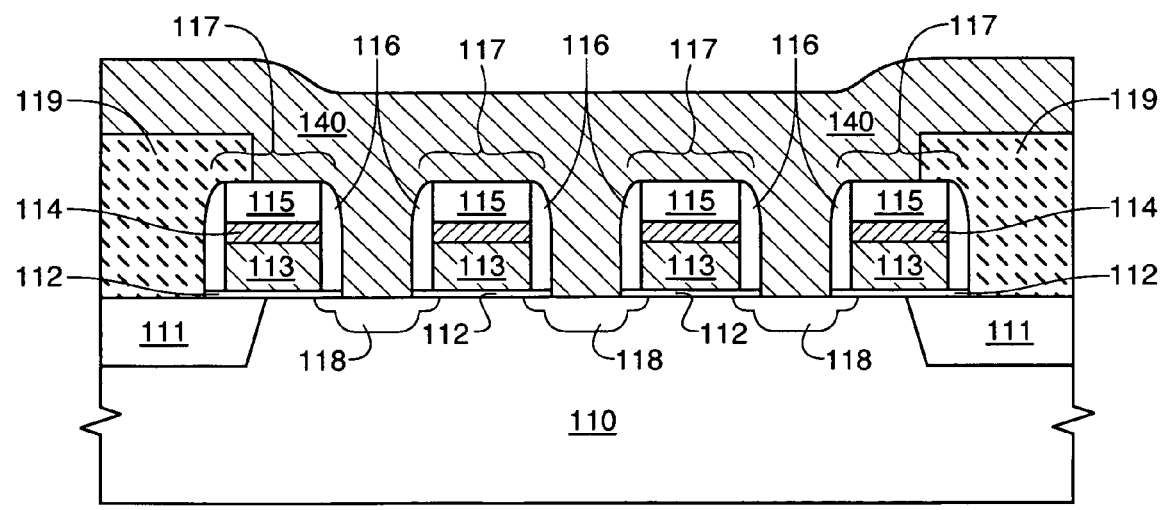
FIG. 14 is a subsequent cross-sectional view taken from FIG. 13 following the formation of conductor overlying the surface of the remaining amorphous carbon, the transistor gates and filling the openings to make contact to the underlying source/drain regions of the transistors.

Referring now to FIG. 14, a conductive layer 140, such as a preferred conductively doped polysilicon (or metal if desired), is formed to overly overlying the surface of the remaining amorphous carbon sections 119, the transistor gate electrodes 117 and to fill the openings between the transistor gate electrodes and thus makes contact to the underlying source/drain regions 118 of the access transistors. It is preferred that the conductive layer 140 be a conductively doped polysilicon that is formed by a process which utilizes a low process temperature that is below 600° C. (a temperature of approximately 550° C. or lower is preferred), such as using a Plasma Enhanced Chemical Vapor Deposition (PECVD) process. Processing the conductively doped polysilicon at a low temperature below 600° C. is important so that the integrity of the amorphous carbon is maintained. The amorphous carbon has weak carbon bonding, bonding that is susceptible to being broken if exposed to excessive heat. At a temperature below 600° C., the films' original characteristics remain without any substantial deformation, burning, volume change or reflow of the film.

Figure 15:
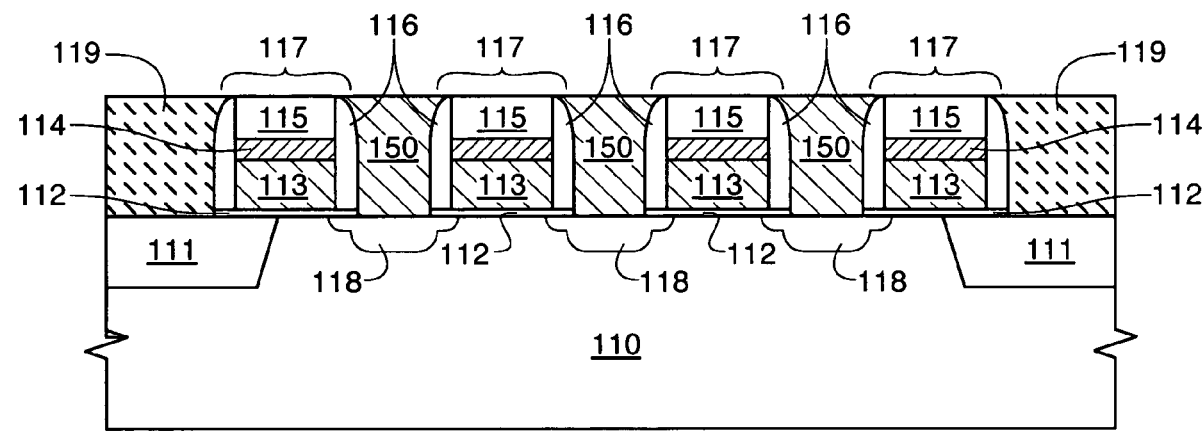
FIG. 15 is a cross-sectional view taken from FIG. 14 following the planarization of the conductor to form contact plugs between the transistor gates and connecting to underlying conductively doped source/drain regions.

Referring now to FIG. 15, the conductive layer 140 and the remaining amorphous carbon sections 119 are planarized down to the transistor gate cap insulation 115 to form self-aligned contact plugs 150 that align between the transistor gate electrodes 117 and connect to underlying conductively doped source/drain regions 118.

Figure 16:
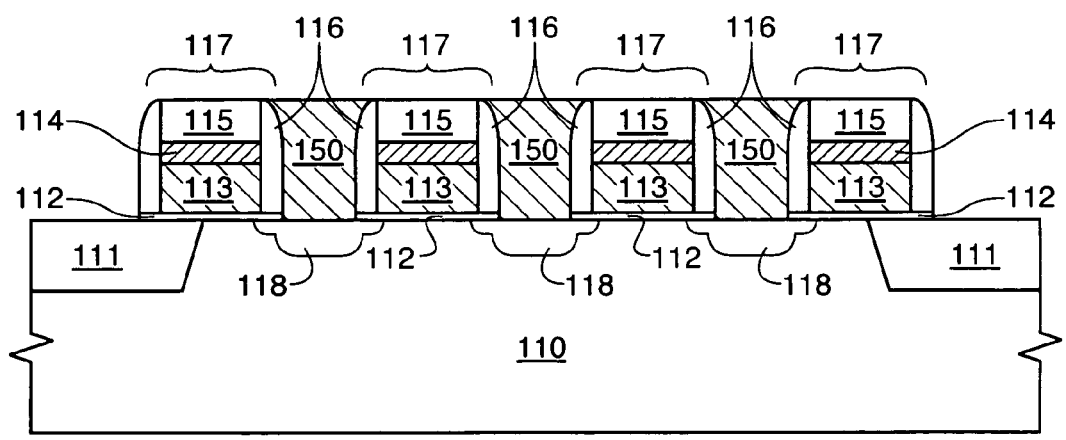
FIG. 16 is a cross-sectional view taken from FIG. 15 following the removal of the remaining amorphous carbon.

As depicted in FIG. 16, the remaining sections of amorphous carbon 119 are removed using a fusion strip/wet clean process. The fusion strip/wet clean processing used to remove the amorphous carbon can be a typical O2 fusion strip, followed by a wet chemistry, such as tungsten ammonium hydroxide/hydrogen peroxide mixture (WAPM), an ammonium hydroxide/hydrogen peroxide mixture (APM) or HF (hydrofluoric acid)) to clean the wafer of any residual prior to the deposition of a subsequent inner dielectric layer.

Figure 17:
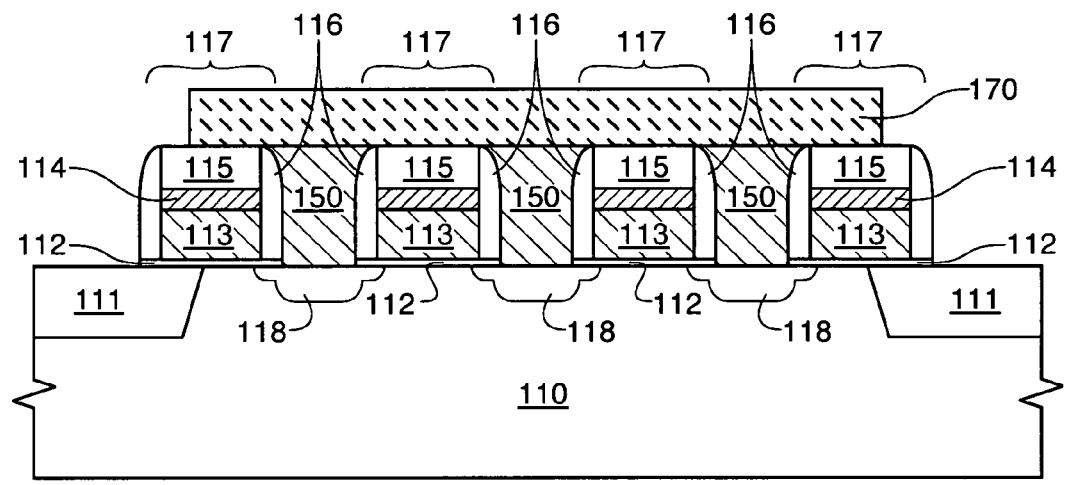
FIG. 17 is a cross-section view taken from FIG. 16 depicting and option formation of a patterning photoresist overlying the active area.

FIG. 17 depicts the optional step of forming a patterning photoresist 170 overlying the self-aligned contact plugs 150 (and thus the active area defined for the access transistors) which will protect the self-aligned contact plugs 150 and prevent dishing that may result during a subsequent planarization step.

Figure 18:
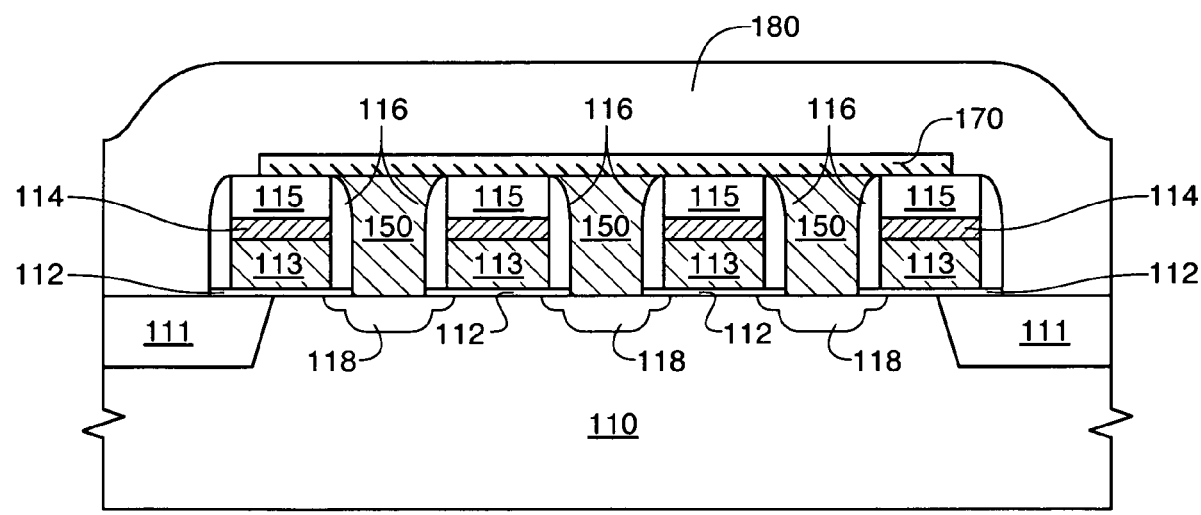
FIG. 18 is a subsequent cross-sectional view taken from FIG. 17 following the formation of an inner dielectric layer (IDL) to cover the semiconductor substrate section.
Figure 19:
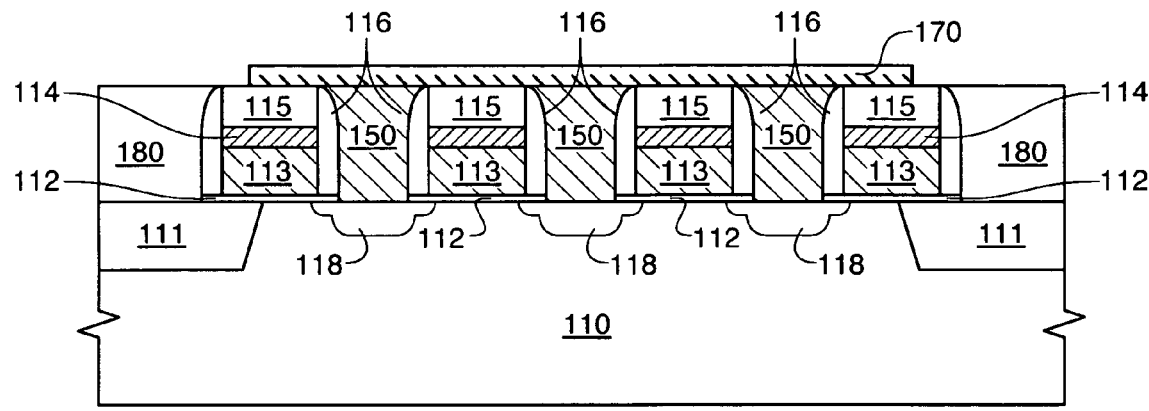
FIG. 19 is a subsequent cross-sectional view taken from FIG. 18 following the planarization of the IDL, with the planarization stopping on the top surfaces of the transistor gates of the storage cell access transistors.

Referring now to FIG. 18, an inner dielectric layer (IDL) 180, such as oxide, to cover the entire semiconductor substrate section. As depicted in FIG. 19 the IDL 180 is planarized, with the planarization stopping on the transistor gate isolation cap 115 of the transistor gate electrodes for each storage cell access transistors. Also shown in FIGS. 18 and 19 is the optional patterned photoresist 170 that is formed as depicted in FIG. 17 if so desired in order to prevent any dishing of the self-aligned contact plugs 150, during the planarization of IDL 180. If optional patterned photoresist 170 is present, it is now stripped.

Figure 20:
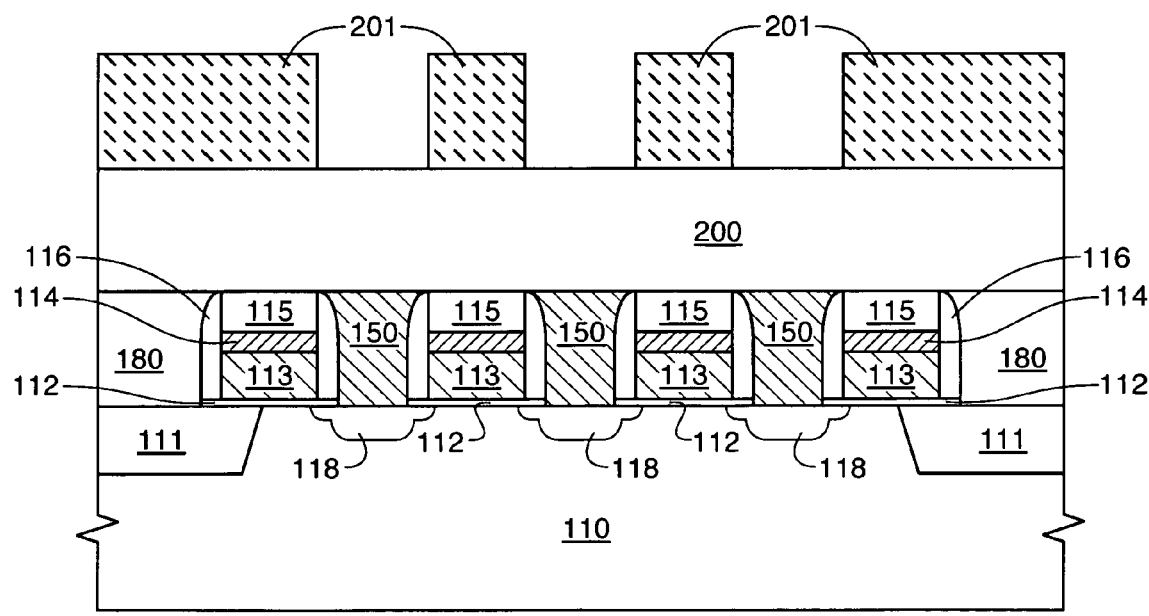
FIG. 20 is a cross-sectional view taken from FIG. 19 following the formation of a second inner dielectric layer (IDL) and an overlying patterned layer of photoresist.

Referring now to FIG. 20 a second inner dielectric layer (IDL) 200 is formed to cover the sections of isolation regions 180, transistor gate electrodes 117 and self-aligned contact plugs 150 and then planarized. Next, a second masking layer 201, such as photoresist is formed and patterned such that the patterned masking layer lines up with the underlying self-aligned contact plugs 150.

Figure 21:
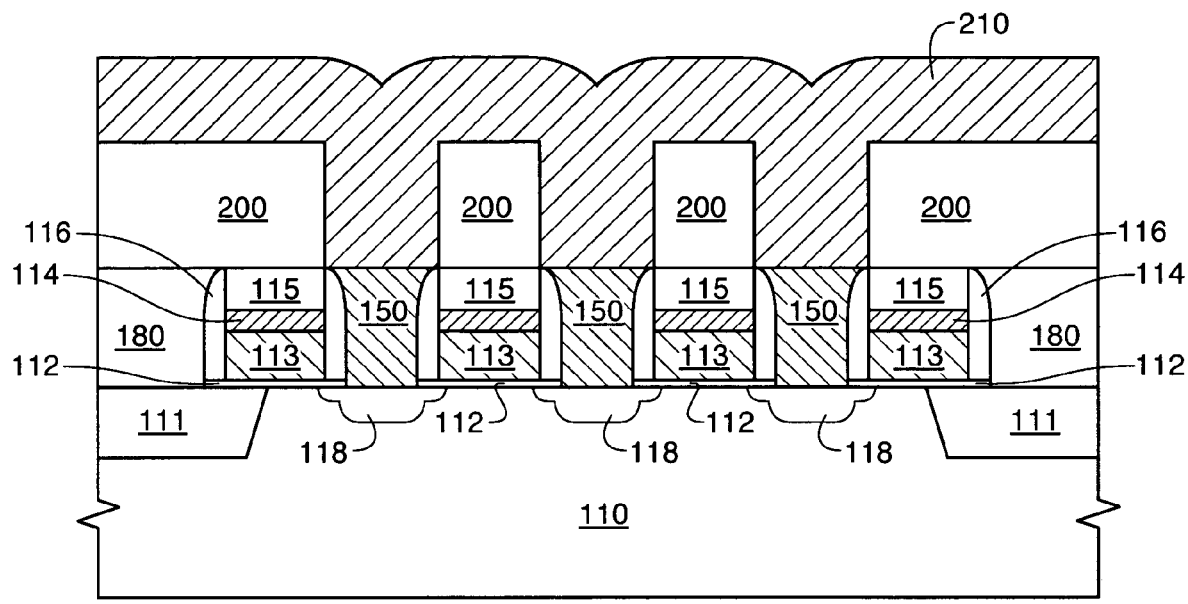
FIG. 21 is a subsequent cross-sectional view taken from FIG. 20 after an etch step forms holes into the second IDL that provides access to the underlying conductive plugs followed by the formation of an overlying conductive layer that covers the second IDL and fills the holes to make contact with the underlying conductive plugs.

Referring now to FIG. 21, an etch step forms holes into the second DL 200 to provide access to the underlying conductive plugs 150 and the masking layer 201 is also stripped. Next, overlying conductive layer 210 is formed that covers the second IDL 200 and fills the holes to make contact with the underlying self-aligned conductive plugs 150.

Figure 22:
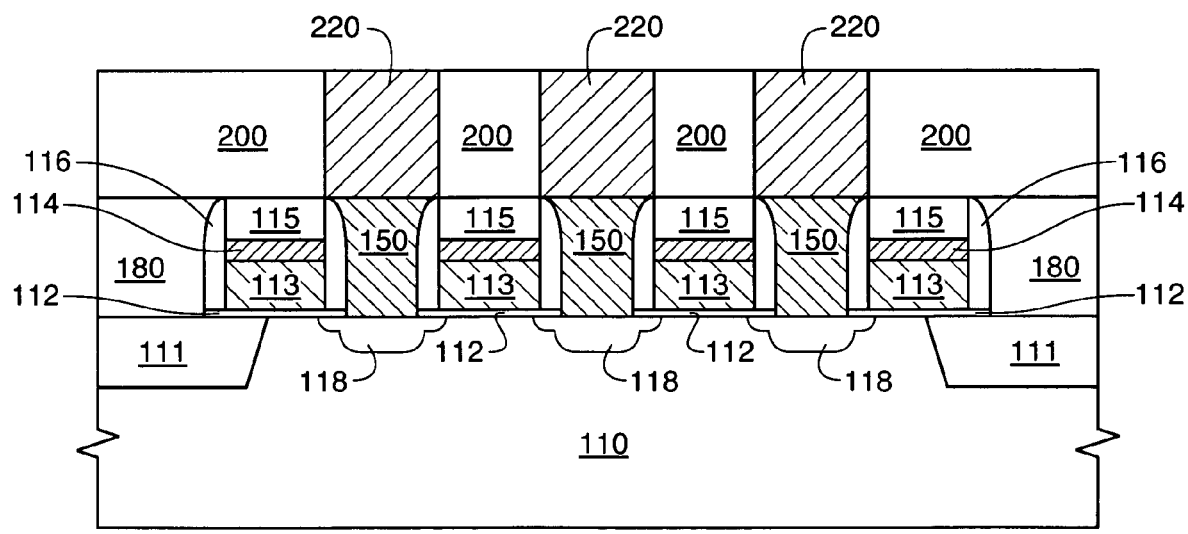
FIG. 22 is a cross-sectional view taken from FIG. 21 following the planarization of the second conductive layer to form a separate interconnect to each underlying conductive plug.

Referring now to FIG. 22, the second conductive layer 210 is planarized to form a separate interconnect 220 to each underlying conductive plug 150.

Figure 23:
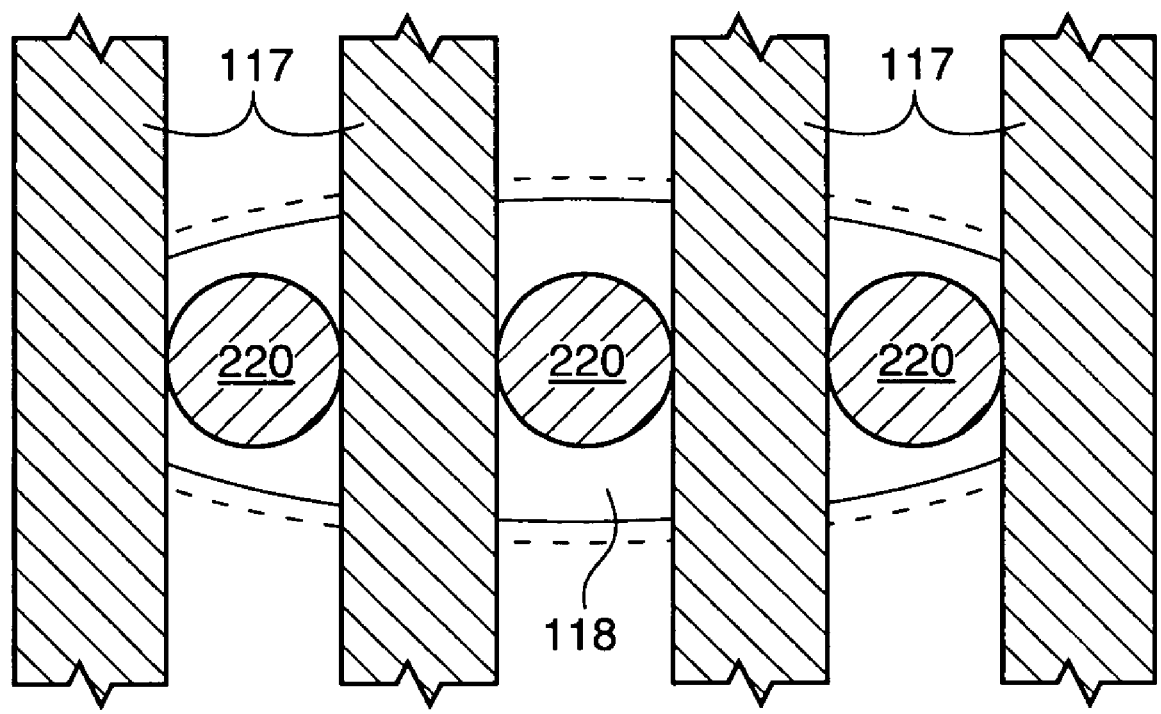
FIG. 23 is an overhead plan view of FIG. 22 showing a completed interconnect structure between transistor source/drain regions and a self-aligned contact plug depicting an embodiment of the present invention.

FIG. 23 is an overhead plan view of FIG. 22 showing a completed interconnect structure between transistor source/drain regions 218 and each self-aligned contact plug 150 (not seen) and the interconnects 220, which depicts a second embodiment of the present invention. The semiconductor assembly is then completed using fabrication methods know to those skilled in the art.

Figure 24:
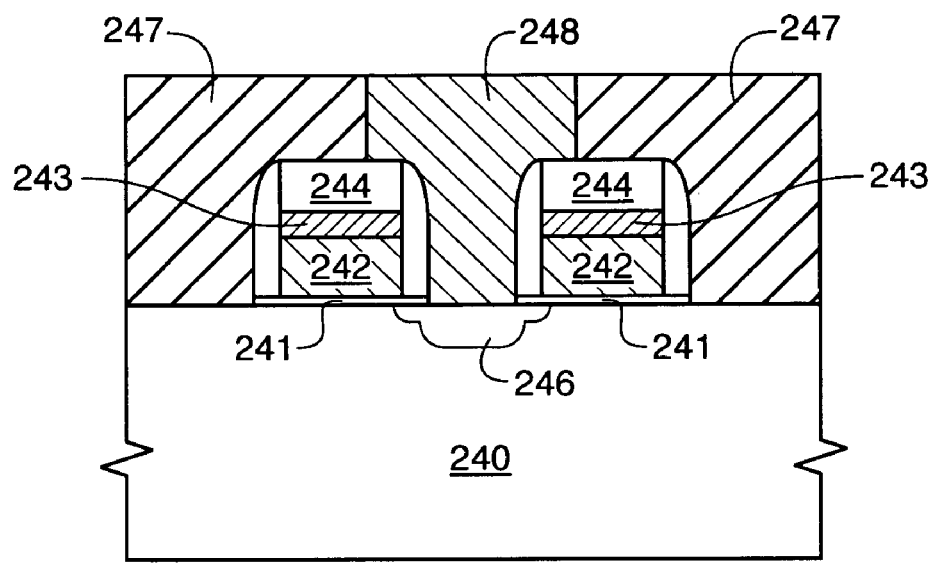
FIG. 24 is a cross-sectional view of a semiconductor substrate section depicting single contact plug formed in an amorphous carbon layer.
Figure 25:
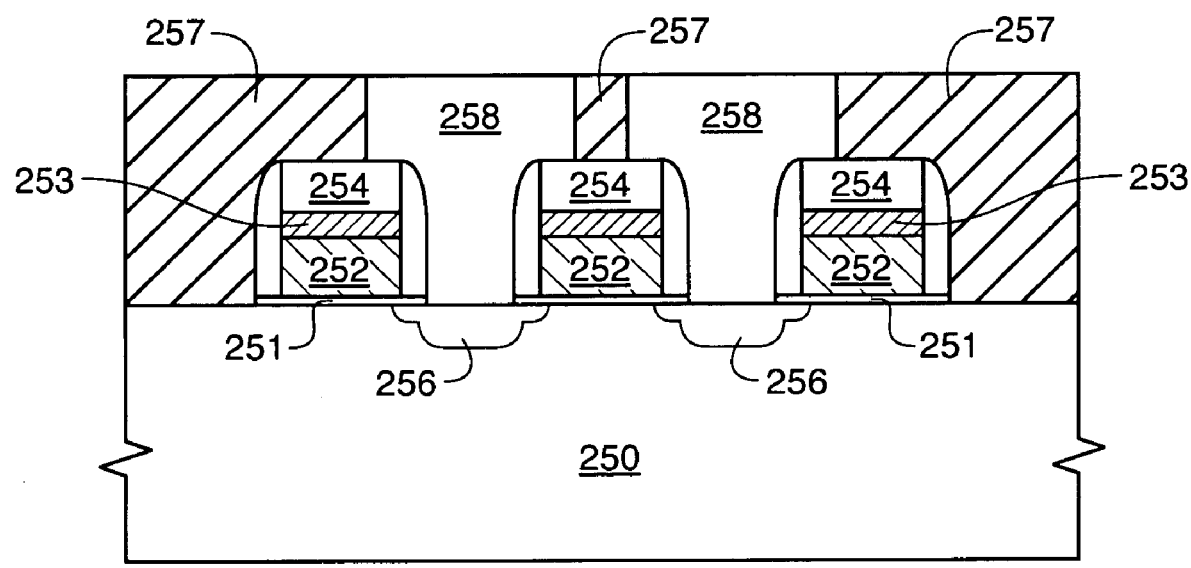
FIG. 25 is a cross-sectional view of a semiconductor substrate section depicting multiple contact plugs formed in an amorphous carbon layer.

Referring now to FIGS. 24 and 25, in process semiconductors are illustrated to show discrete contacts. In FIG. 24, a single contact plug 248 is formed in the amorphous carbon layer 247. In this embodiment, the amorphous carbon layer 247 is patterned and removed as explained above to open the contact region and a conductive material, such as polysilicon, is used to form the plug 248. The amorphous carbon layer 247 and polysilicon can be planarized as explained in the previous embodiments. The planarization can stop on the top of the gate stack nitride 244 or leave some of the plug extending above the gate stacks as illustrated. Subsequent process operations, not shown in FIG. 24, remove the remaining amorphous carbon layer 247 and replace it with a dielectric material, as explained in the previous embodiments.

Referring now to FIG. 25, multiple single contact plugs 258 are formed in the amorphous carbon layer 257. In this embodiment, the amorphous carbon layer 257 is patterned and removed as explained above to open the contact regions and a conductive material, such as polysilicon, is used to form the plugs 258. The amorphous carbon layer and polysilicon can be planarized as explained in the previous embodiments. The planarization can stop on the top of the gate stack nitride 254 or leave some of the plug extending above the gate stacks as illustrated. Subsequent process operations, not shown in FIG. 25, remove the remaining amorphous carbon layer 257 and replace it with an dielectric material, as explained in the previous embodiments.

Figure 26:
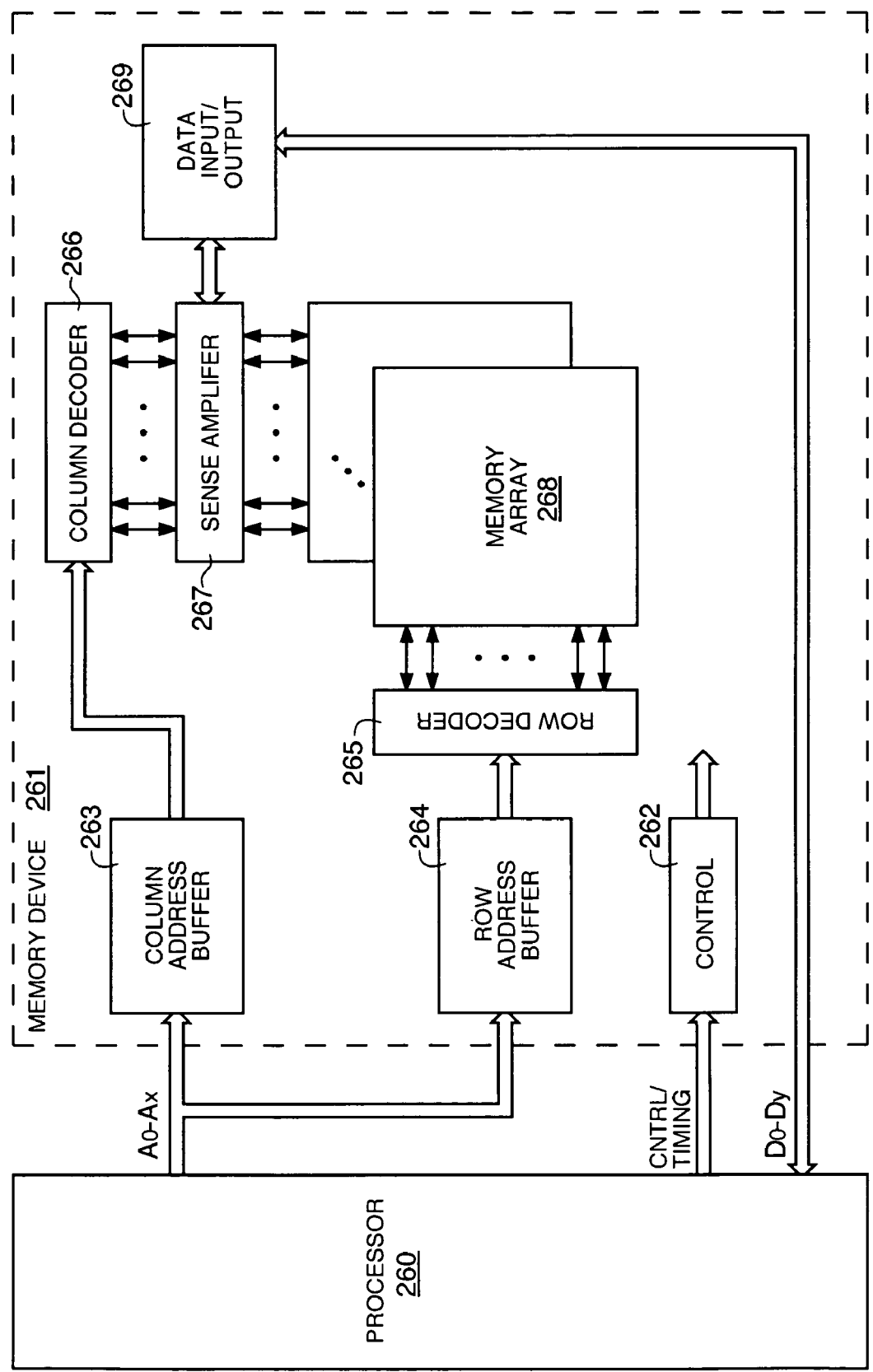
FIG. 26 is a simplified block diagram of a semiconductor system comprising a processor and memory device to which the present invention may be applied.

Embodiments of present invention to form self-aligned contacts to transistor structures of the semiconductor devices may be applied to a semiconductor system, such as the one depicted in FIG. 26. FIG. 26 represents a general block diagram of a semiconductor system, the general operation of which is known to one skilled in the art, the semiconductor system comprising a processor 260 and a memory device 261 showing the basic sections of a memory integrated circuit, such as row and column address buffers, 263 and 264, row and column decoders, 265 and 266, sense amplifiers 267, memory array 268 and data input/output 269, which are manipulated by control/timing signals from the processor through control 262.

It is to be understood that although the present invention has been described with reference to several preferred embodiments, various modifications, known to those skilled in the art, such as utilizing the disclosed methods to form self-aligned contacts in any semiconductor device, may be made to the process steps presented herein without departing from the invention as recited in the several claims appended hereto.

What is claimed is:

1. A method of fabricating a transistor source/drain contact between adjacent transistor gate structures comprising:
   depositing an amorphous carbon filler material at least in a region between the adjacent transistor gate structures;
   planarizing the amorphous carbon filler material between the adjacent transistor gate structures;
   removing the planarized amorphous carbon filler material using an etching process comprising $O_2$ having a removal selectivity to nitride greater than 40:1 to form a contact opening, followed by a wet chemistry clean comprising tungsten ammonium hydroxide/hydrogen peroxide mixture (WAPM) chemistry; and
   depositing a conductive material in the contact opening.

2. The process of claim 1 further comprising:
   planarizing the conductive material to form a contact in the contact opening;
   forming an interconnect opening in a planarized dielectric to provide access to the contact; and
   forming an conductive interconnect to the contact from an interconnect conductive material.

3. The process of claim 2 further comprising:
   forming a patterned photoresist over the contact prior to the step of forming an interconnect opening.

4. The process of claim 2, wherein the interconnect opening is self-aligning with the contact.

5. The process of claim 1, wherein the amorphous carbon is a transparent amorphous carbon.

6. The process of claim 1, wherein the conductive material comprises conductive polysilicon or metal.

7. A method of fabricating a transistor source/drain contact between adjacent transistor gate structures having nitride sidewall spacers comprising:
   depositing an amorphous carbon filler material at least in a region between the adjacent transistor gate structures;
   planarizing the amorphous carbon filler material between the adjacent transistor gate structures;
   removing the planarized amorphous carbon filler material using an etching process comprising $O_2$ having a removal selectivity to nitride greater than 40:1 to form a contact opening having an aspect ratio greater than about 5:1, followed by a wet chemistry clean comprising tungsten ammonium hydroxide/hydrogen peroxide mixture (WAPM) chemistry; and
   depositing a conductive material in the contact opening.

8. The process of claim 7 further comprising:
   planarizing the conductive material to form a contact in the contact opening;
   forming an interconnect opening in a planarized dielectric to provide access to the contact; and
   forming an conductive interconnect to the contact from a interconnect conductive material.

9. The process of claim 8, wherein the interconnect opening is self-aligning with the contact.

10. The process of claim 7, wherein the amorphous carbon is a transparent amorphous carbon.

11. The process of claim 7, wherein the conductive material comprises conductive polysilicon or metal.

12. A method of fabricating a transistor source/drain connection between adjacent transistor gate structures comprising:

depositing an amorphous carbon filler material at least in a region between the adjacent transistor gate structures;

planarizing the amorphous carbon filler material between the adjacent transistor gate structures;

selectively dry developing the planarized amorphous carbon filler material using an etching process comprising $O_2$ having a removal selectivity to nitride greater than 40:1 to form a contact opening, followed by a wet chemistry clean comprising tungsten ammonium hydroxide/hydrogen peroxide mixture (WAPM) chemistry; and depositing a conductive material in the contact opening.

13. The process of claim 12 further comprising:

planarizing the conductive material to form a contact in the contact opening;

forming an interconnect opening in a planarized dielectric to provide access to the contact; and forming an conductive interconnect to the contact from an interconnect conductive material.

14. The process of claim 13, wherein the interconnect opening is self-aligning with the contact.

15. The process of claim 12, wherein the amorphous carbon is a transparent amorphous carbon.

16. The process of claim 12, wherein the conductive material comprises conductive polysilicon or metal.

* * * * *